(12) United States Patent
Sakaguchi et al.

(10) Patent No.: US 7,348,624 B2
(45) Date of Patent: Mar. 25, 2008

(54) SEMICONDUCTOR DEVICE INCLUDING A CAPACITOR ELEMENT

(75) Inventors: Akemi Sakaguchi, Kanagawa (JP); Toshio Ohkido, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 64 days.

(21) Appl. No.: 11/256,925

(22) Filed: Oct. 25, 2005

(65) Prior Publication Data

US 2006/0086965 A1    Apr. 27, 2006

(30) Foreign Application Priority Data

Oct. 26, 2004    (JP)    ............................. 2004-310601

(51) Int. Cl.
  *H01L 27/108*    (2006.01)
  *H01L 29/76*    (2006.01)
  *H01L 29/94*    (2006.01)

(52) U.S. Cl. .................. 257/307; 257/296; 257/306
(58) Field of Classification Search ............... 257/307, 257/296, 306
See application file for complete search history.

(56) References Cited

U.S. PATENT DOCUMENTS

| 5,583,359 A | * | 12/1996 | Ng et al. ................... 257/306 |
| 6,819,542 B2 | * | 11/2004 | Tsai et al. ................... 361/304 |
| 2005/0208728 A1 | * | 9/2005 | Benetik et al. ............. 438/393 |

FOREIGN PATENT DOCUMENTS

| JP | 11-168182 | 6/1999 |
| JP | 2003-530699 | 10/2003 |

* cited by examiner

*Primary Examiner*—Anh Phung
*Assistant Examiner*—Allison P Bernstein
(74) *Attorney, Agent, or Firm*—McGinn IP Law Group, PLLC

(57) ABSTRACT

A semiconductor device having a capacitor including a first electrode, a second electrode and an insulator. The semiconductor device includes first layers and second layers laminated alternately. The first layers each includes lines of the first electrode and lines of the second electrode arranged alternately and extending in a first direction. The second layers each including lines of the first electrode and lines of the second electrode arranged alternately and extending in a second direction. First via holes connect the lines of the first electrode in each of the first layers and lines of the first electrode in each of the second layers. Second via holes connect the lines of the second electrode in each of the first layers and the lines of the second electrode in each of the second layers.

19 Claims, 11 Drawing Sheets

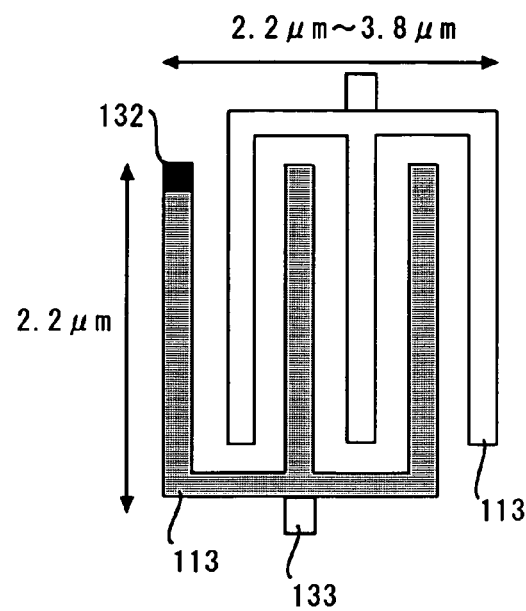
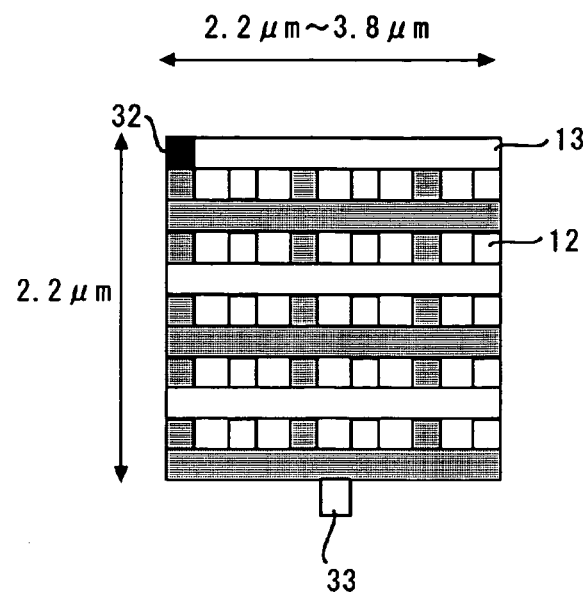
Fig. 9A          Fig. 9B
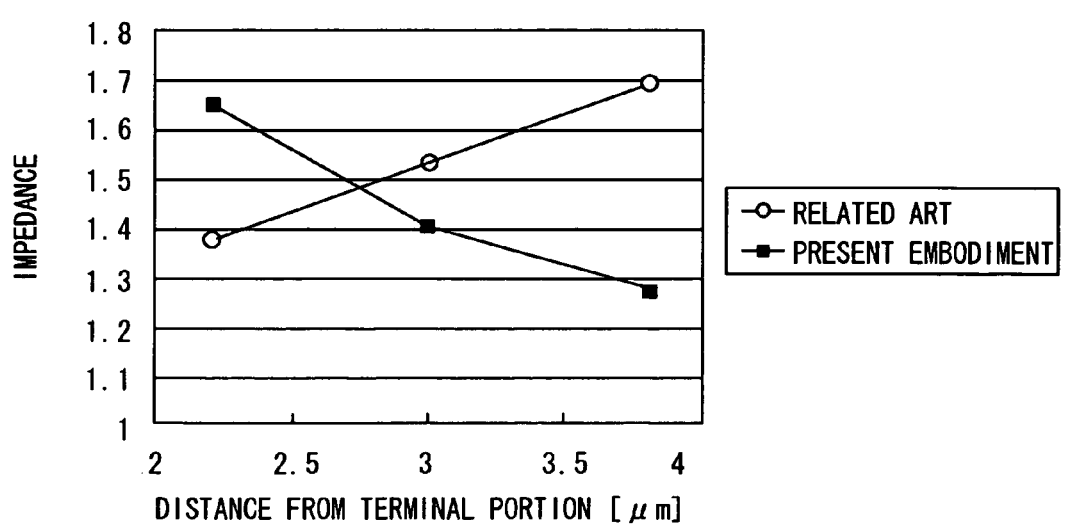
Fig. 10

☐ : VIA HOLE
UNIT : μm

☐ : VIA HOLE
UNIT : μm

SEMICONDUCTOR DEVICE INCLUDING A CAPACITOR ELEMENT

BACKGROUND OF THE INVENTION

1. Field of the Invention

The present invention relates to a semiconductor device including a capacitor element.

2. Description of Related Art

As the recent trend is shifting toward compact and lightweight electronic devices operable with high speeds and high frequency, there is an increasing demand to raise an integration degree of a semiconductor integrated circuit. Similarly, a higher capacitance per unit area than ever before has been required of a capacitor element mounted to the semiconductor integrated circuit.

As a capacitor element for an integrated circuit, proposed are a capacitor element structured such that parallel plates forming upper and lower electrodes sandwich a dielectric, and a comb-like capacitor element realized by improving upon the above one so as to form a capacitance between multilayer lines (see Japanese Patent Translation Publication No. 2003-530699 and Japanese Unexamined Patent Publication No. 11-168182, for example).

FIG. 15 is an upper view showing the structure of the capacitor element disclosed in Japanese Patent Translation Publication No. 2003-530699, and FIG. 16 is a perspective sectional view of the capacitor element of FIG. 15. In a capacitor element 104, as shown in FIGS. 15 and 16, plural wiring layers (e.g., a first layer line 111, a second layer line 112, a third layer line 113, and a fourth layer line 114) are laminated on a substrate 131 made of a semiconductor material, lines of the respective wiring layers laminated on the substrate 131 are arranged to alternately form different electrodes (first electrode A and second electrode B) as shown in FIG. 16. A space between the wiring layers and a space between the lines forming the wiring layers are filled with a dielectric (not shown). Along the direction vertical to the substrate 131, the lines of the same electrode are arranged, and the lines of the respective layers (respective layer lines) are electrically connected together through first via holes 121 or second via holes 122 to constitute one vertical plate. The vertical plate forms an electrode of the capacitor element.

FIG. 17 is a perspective view showing the structure of the capacitor element disclosed in Japanese Unexamined Patent Publication No. 11-168182, FIG. 18A is an upper view of the capacitor element of FIG. 17, and FIG. 18B is a sectional view taken along the line IV-IV of FIG. 18A. As shown in FIG. 17, in a capacitor element 105, plural wiring layers (for example, a first layer line 111a, a second layer line 112a, and a third layer line 113a) are laminated on a substrate 131a made of a semiconductor material, and lines of the respective wiring layers laminated on the substrate 131a are arranged to alternately form different electrodes (first electrode A and second electrode B) as shown in FIG. 17. A space between the wiring layers and a space between lines forming the respective wiring layers are filled with a dielectric (not shown) as in the related art. Along the direction vertical to the substrate 131a, the lines of different electrodes are alternately arranged. As shown in FIG. 18A, first via holes 121a and second via holes 122a for connecting between different wiring layers of the same electrode are formed at one ends of the lines. Besides, Japanese Unexamined Patent Publication No. 11-168182 discloses such a capacitor element that the line of the second layer line 112a is arranged orthogonally to the first layer line 111a and third layer line 113a.

The total capacitance of the capacitor element disclosed in Japanese Patent Translation Publication No. 2003-530699 is the sum of the total crossover capacitance between the vertical plates, and the total fringe capacitance between plural combined vertical plates. Further, the total capacitance of the capacitor element disclosed in Japanese Unexamined Patent Publication No. 11-168182 is the sum of the capacitance between adjacent lines of different electrodes arranged in the direction horizontal to the substrate, the capacitance between adjacent lines of different electrodes arranged in the vertical direction, the capacitance of the line forming the second electrode that is close and opposite to the first via hole at one end of the line, the capacitance of the line forming the first electrode that is close and opposite to the second via hole at one end of the line, and the total fringe capacitance. The use of such capacitor elements enables higher capacitance density than the conventional comb-like capacitor element.

Thus, there has been a strong demand for the technique capable of making the most of a high integration process, and increasing a capacitance per unit area.

SUMMARY OF THE INVENTION

An aspect of the invention provides a semiconductor device including a capacitor including a first electrode, a second electrode and an insulator therebetween. The semiconductor device comprises first layers and second layers laminated alternately. The first layers each includes lines of a first electrode and lines of a second electrode arranged alternately and extending in a first direction. The second layers each includes lines of the first electrode and lines of the second electrode arranged alternately and extending in a second direction different from the first direction.

The semiconductor device further comprises first via holes connecting the lines of the first electrode in each of the first layers and lines of the first electrode in each of the second layers at crossing points of the lines of the first electrode, and second via holes connecting the lines of the second electrode in each of the first layers and the lines of the second electrode in each of the second layers at crossing points of the lines of the second electrode.

Another aspect of the invention provides a semiconductor device including a capacitor including a first electrode, a second electrode and an insulator therebetween. The semiconductor device comprises a first layer and a second layer laminated with the first layer. The first layer includes lines of the first electrode and lines of the second electrode, the lines of the first electrode and the lines of the second electrode being alternately arranged. The second layer includes lines of the first electrode extending in a direction different from the lines of the first electrode and the lines of the second electrode in the first layer.

According to the capacitor element disclosed in Japanese Patent Translation Publication No. 2003-530699, the lines of respective wiring layers alternately form the lines of different electrodes, so the total capacitance is the sum of the total crossover capacitance between the vertical plates, and the total fringe capacitance.

According to the capacitor element disclosed in Japanese Unexamined Patent Publication No. 11-168182, the total capacitance is the sum of the capacitance between adjacent lines of different electrodes arranged in the horizontal direction, the capacitance between adjacent lines of different electrodes arranged in the vertical direction, the capacitance between the first via hole at one end and the line having the second electrode that is close and opposite to the first via hole, the capacitance between the second via hole at one end and the line having the first electrode that is close and opposite to the second via hole, and the total fringe capacitance.

Japanese Unexamined Patent Publication No. 11-168182 discloses, as mentioned above, the capacitor element in which the lines of the adjacent wiring layers extend orthogonally. Though the arrangement of the via holes in this capacitor element remains uncertain because there is no description about it, the via holes connected with the other layers at only one ends of the lines are supposedly formed as in the case where the lines of the lines layers of FIG. 17 extend in the same direction in each layer. In this case, the total capacitance of the capacitor element is the sum of the capacitance between adjacent lines of different electrodes arranged in the horizontal direction, the capacitance between adjacent lines of different electrodes arranged in the vertical direction, the capacitance of the capacitance between the first via hole at one end and the line having the second electrode that is close and opposite to the first via hole, the capacitance between the second via hole at one end and the line having the first electrode that is close and opposite to the second via hole, and the total fringe capacitance, similar to the above one.

On the other hand, according to the capacitor element according to one aspect of the invention, the lines of different electrodes are alternately arranged in a first layer and a second layer, and besides, the longitudinal (extending) direction of the lines of the first layer is different from that of the second layer, and the first via holes and second via holes, each of which interconnects the lines of the same electrode in the first layer and the second layer, are alternately arranged between the first layer and the second layer (in a checkered pattern). Hence, the capacitance density can be made higher than that of Japanese Patent Translation Publication No. 2003-530699. That is, the total capacitance of the capacitor element according to the one aspect of the invention is the sum of (1) a capacitance between the lines of different electrodes (first electrode and second electrode) arranged in each layer (first layer and second layer), (2) a capacitance between the lines of different electrodes adjacent in the vertical direction, (3) a capacitance between the line of the second electrode and the first via hole which is opposed diagonally to the line via a dielectric, and a capacitance between the line of the first electrode and the second via hole which is opposed diagonally to the line via a dielectric, (4) a capacitance between the adjacent first via hole and second via hole, and (5) the total fringe capacitance. Thus, the capacitance density is increased.

Further, a capacitor element can be formed with usual high integration processes in a semiconductor manufacturing process, thereby attaining cost reduction.

The present invention has a beneficial effect that a semiconductor device incorporating a capacitor element capable of increasing a capacitance density can be provided.

BRIEF DESCRIPTION OF THE DRAWINGS

The above and other objects, advantages and features of the present invention will be more apparent from the following description taken in conjunction with the accompanying drawings, in which:

FIG. 9A illustrates simulation conditions of Comparative Example 1;

FIG. 9B illustrates simulation conditions of Example 1;

FIG. 10 is a graph plotting the impedance values with varying distances from an terminal portion;

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Figure 1:
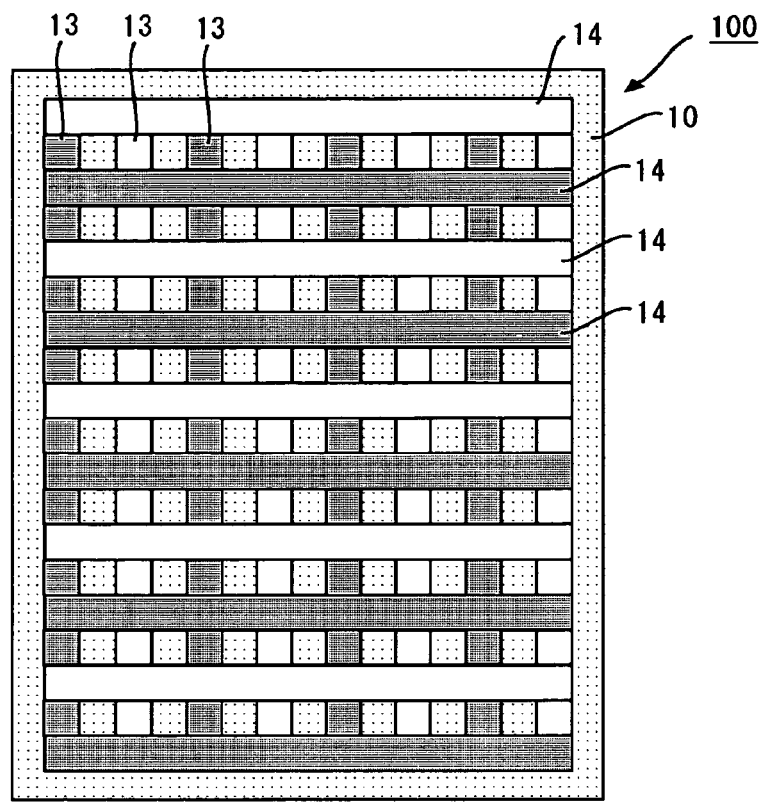
FIG. 1 is a schematic upper view showing the structure of a capacitor element of a semiconductor device according to an embodiment of the present invention.
Figure 2:
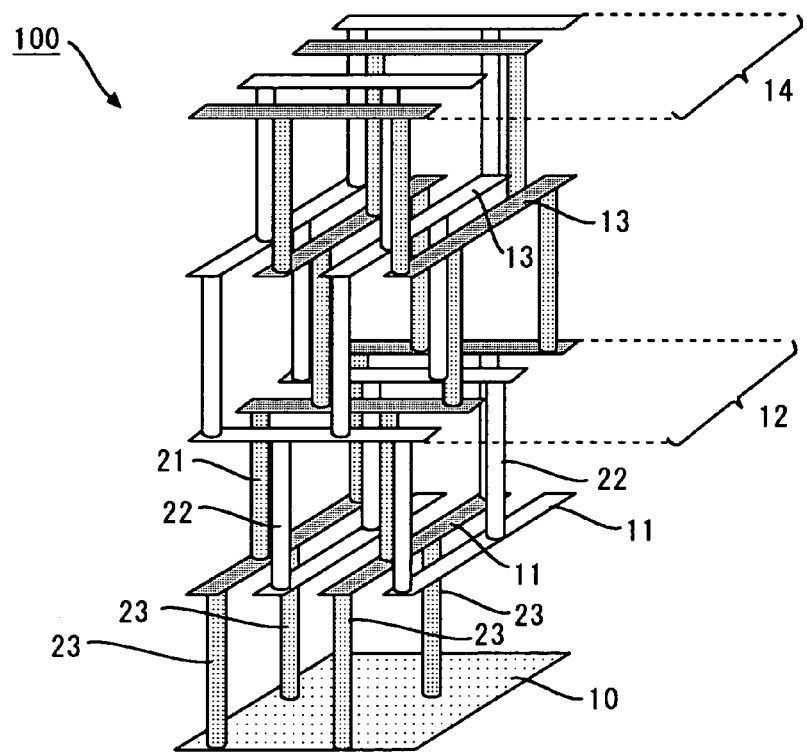
FIG. 2 is a schematic 3D diagram showing the capacitor element according to the embodiment of the present invention.
Figure 3:
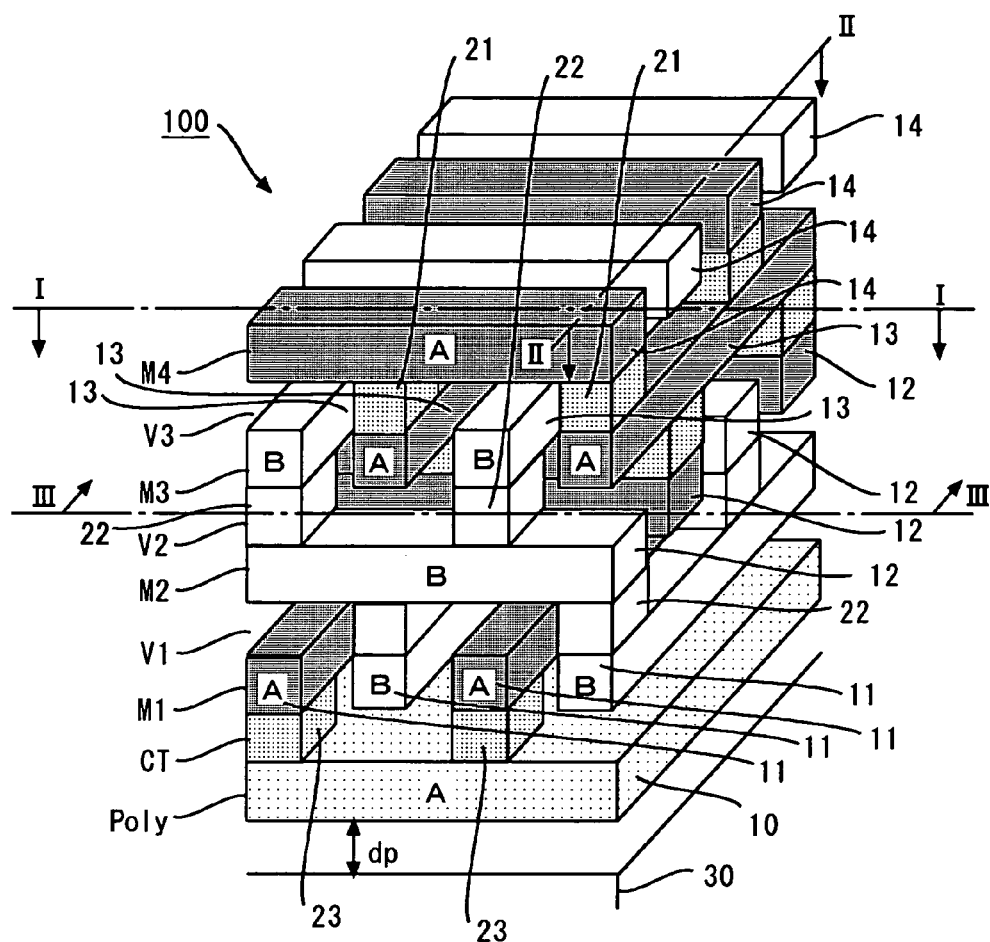
FIG. 3 is a perspective view showing the capacitor element according to the embodiment of the present invention.

FIG. 1 is a schematic upper view showing a capacitor element of a semiconductor device according to this embodiment. FIG. 2 is a schematic 3D diagram showing the capacitor element according to this embodiment. FIG. 3 is a perspective view showing the capacitor element according to the present invention.

The semiconductor device according to this embodiment includes layers formed of plural lines. The respective layers have plural lines that are embedded in the dielectric (not shown) to alternately form a first electrode A and a second electrode B in parallel to each other.

More specifically, as shown in FIG. 3, formed on a substrate 30 are a plate lowermost electrode 10, first layer lines 11 and third layer lines 13 as first layers, second layer lines 12 and fourth layer lines 14 as second layers, first via holes 21 interconnecting the lines forming the first electrode A, and second via holes 22 interconnecting the lines forming the second electrode B. A space containing neither line nor via hole is filled with an interlayer insulating film as a dielectric, for example, but it is not shown in the drawings except FIG. 4 for simplicity's sake.

The numbers of first and second layers, via holes, and lines shown in FIGS. 1 to 3 are set by way of illustration, and the present invention is not limited thereto.

The substrate 30 is made of a semiconductor material. The plate lowermost electrode 10 is formed on the substrate 30 via the dielectric, namely the dielectric is placed between the plate lowermost electrode 10 and the substrate 30.

The lowermost electrode 10 can be made from a polysilicon layer, a metal layer, a diffusion layer, or the like. The lowermost electrode 10 serves as either a part of the first electrode A or a part of the second electrode B. In this embodiment, the lowermost electrode 10 constitutes a part of the first electrode A, and is made up of a polysilicon layer.

As shown in FIGS. 2 and 3, the plural first layer lines 11 are spaced each other and extending in parallel in a first direction. The plural lines alternately form the first electrode A and the second electrode B. Namely, lines of the first electrode A and lines of the second electrode B are arranged alternately. A metal layer used for typical semiconductor manufacturing processes can be employed as a material for the lines. With such a structure, a capacitor element requiring no special process can be provided.

The second layer lines 12 overlies, as shown in FIGS. 2 and 3, the first layer lines 11. The plural lines 12 are spaced each other and arranged in parallel. The lines 12 are extending in a second direction different from the first direction. More specifically, each line 12 is extending orthogonally to the longitudinal direction of the first layer lines 11 (the first direction). The plural lines 12 alternately form the first electrode A and the second electrode B.

The third layer lines 13 overlie the second layer lines 12, and the plural lines 13 are spaced and extending in the first direction in parallel to each other, similar to the first layer line 11. More specifically, each line 13 is arranged orthogonally to the second layer line 12. In this embodiment, the first layer lines 11 and third layer lines 13 are formed so as to overlap completely each other as viewed from the stacking direction of the lines of each layer. Further, the opposite lines in the stacking direction form different electrodes.

The fourth layer lines 14 overlie the third layer lines 13, and the plural lines 14 are extending in the second direction and arranged at some distance, similar to the second layer line 12. To elaborate, each line 14 is arranged orthogonally to the third layer line 13. In this embodiment, the second layer lines 12 and the fourth layer lines 14 are formed so as to overlap completely each other as viewed from the stacking direction of the lines of each layer. Further, the opposite lines in the stacking direction form different electrodes.

The first via holes 21 and the second via holes 22 interconnect the lines of the first layer lines 11 to the fourth layer lines 14. The first via holes 21 interconnect the lines of the first electrode A of adjacent layers at opposing (crossing) positions of the lines. Besides, the second via holes interconnect the lines of the second electrode B of adjacent layers at opposing (crossing) positions.

In the example of FIG. 2, in the stacking direction of the lines of the respective layers, the first and second via holes 21, 22 interconnecting the first layer lines 11 and the second layer lines 12 are formed so as to overlap the first and second via holes 21, 22 interconnecting the third layer lines 13 and the fourth layer lines 14 (the formation positions of the via holes do not necessarily need to overlap). Further, the opposing lines in the stacking direction are constituents of different electrodes, so the opposing via holes are of different electrodes.

Figure 4:
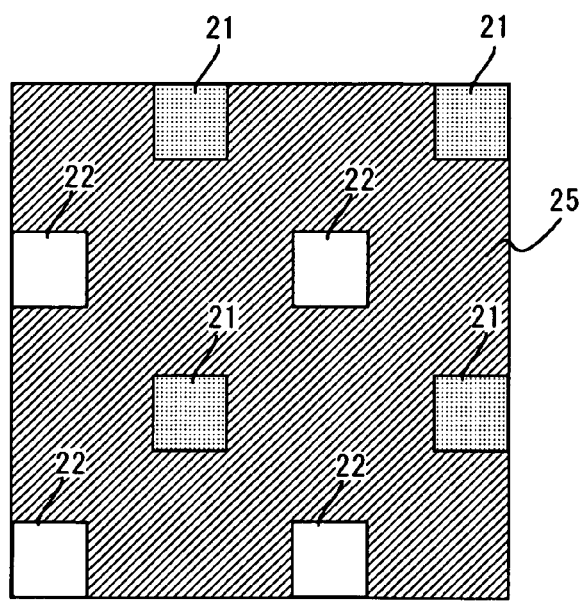
FIG. 4 is an end view showing the section taken along the line III-III of FIG. 3.

FIG. 4 is an end view showing the section taken along the line III-III of FIG. 3. Reference numeral 25 of FIG. 4 denotes an interlayer insulating film as a dielectric layer. As shown in FIG. 4, the via holes interconnecting adjacent lines of the different layers are arranged such that the first via holes 21 and the second via holes 22 are alternately formed in the vertical and lateral directions of FIG. 3 (in a checkered pattern). This embodiment produces an effect of lowering the electrode impedance when a capacitance value is increased. This is because more current paths are obtained by arranging the lines of adjacent layers so as for their longitudinal directions to be orthogonal to each other, and arranging the first via holes 21 and the second via holes 22 alternately in the vertical and lateral directions (in a checkered pattern) on the same plate. Besides, the alternate lines are formed to overlap each other and constitute different electrodes as viewed from the stacking direction of respective layer lines, so the current paths can extend in a net-like fashion more effectively. As a result, the impedance can be more effectively lowered.

The first layer line 11 forming apart of the first electrode A is electrically connected face to face with the lowermost electrode 10 via a third via holes 23. In FIG. 3, the first layer lines 11 are connected with the lowermost electrode 10 via the four via holes. In contrast, the first layer lines 11 forming a part of the second electrode B are not connected with the lowermost electrode 10 via the via hole, so no electrical connection is established therebetween.

In the capacitor element 100 of this embodiment, as shown in FIG. 3, a polysilicon (Poly) layer serving as the lowermost electrode 10 is formed on the substrate as a first layer. A contact layer CT forming the third via holes interconnecting the lowermost electrode 10 and the first layer lines are formed thereon as a second layer. A metal layer M1 forming the first layer lines 11 is formed thereon, and a via hole layer V1 is laminated thereon. A metal layer M2 forming the second layer lines 12 is formed thereon, and a via hole layer V2 is laminated thereon. A metal layer M3 forming the third layer lines 13 is formed thereon, and a via hole layer V3 is laminated thereon. A metal layer M4 forming the fourth layer lines 14 is formed thereon. Those layers are used in the general semiconductor manufacturing process, so a capacitor element can be manufactured without adding a special process. Accordingly, it is possible to lower costs.

Figure 5:
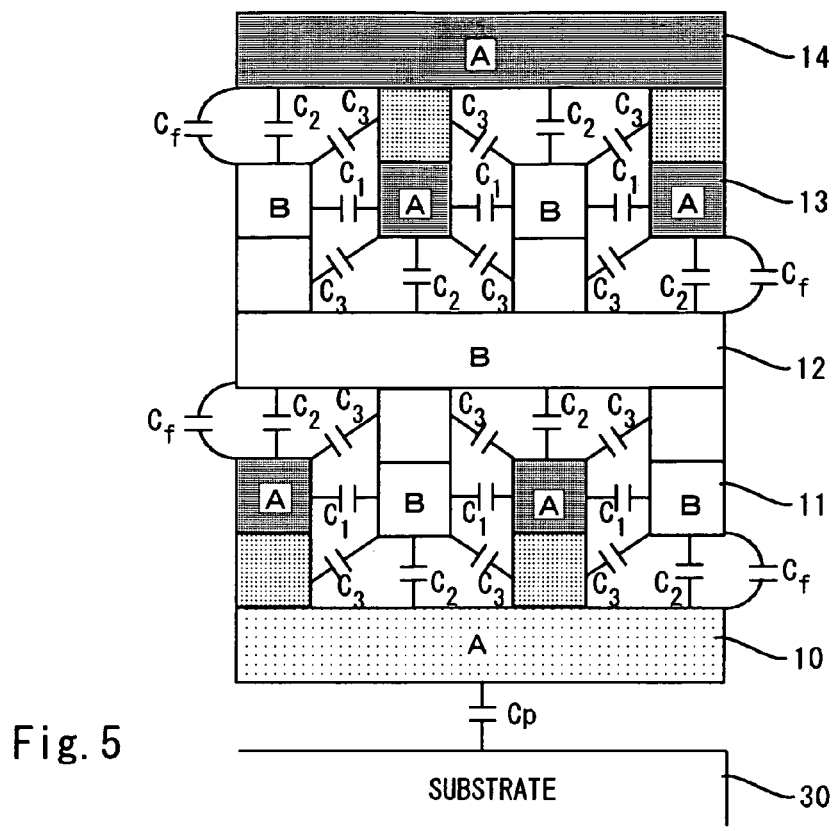
FIG. 5 is a sectional view taken along the line I-I of FIG. 3.
Figure 6:
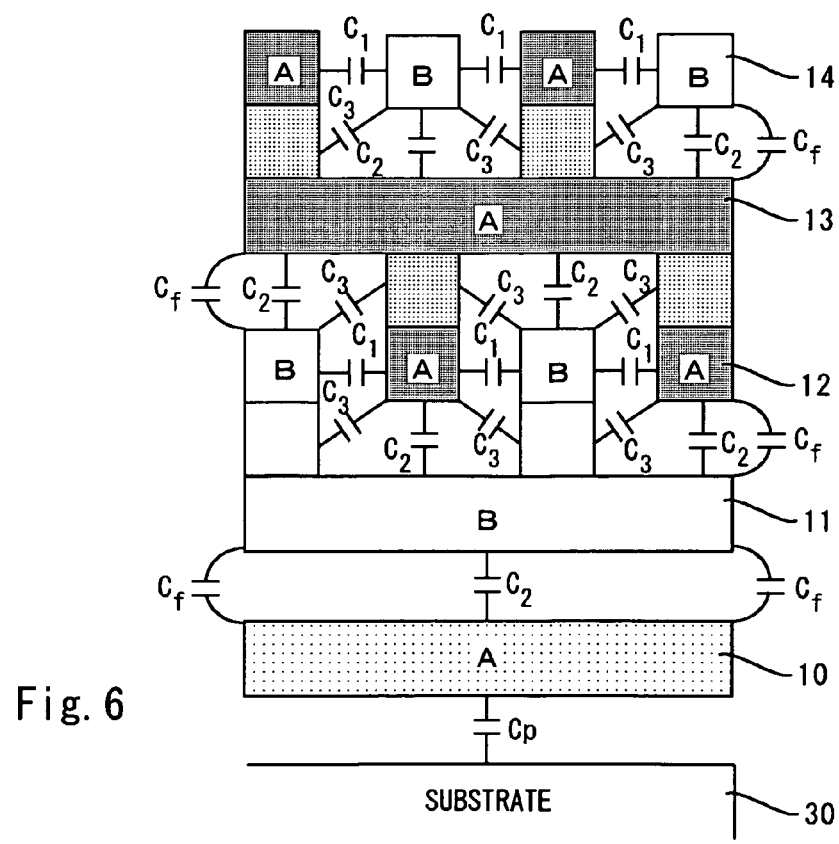
FIG. 6 is a sectional view taken along the line II-II of FIG. 3.
Figure 7:
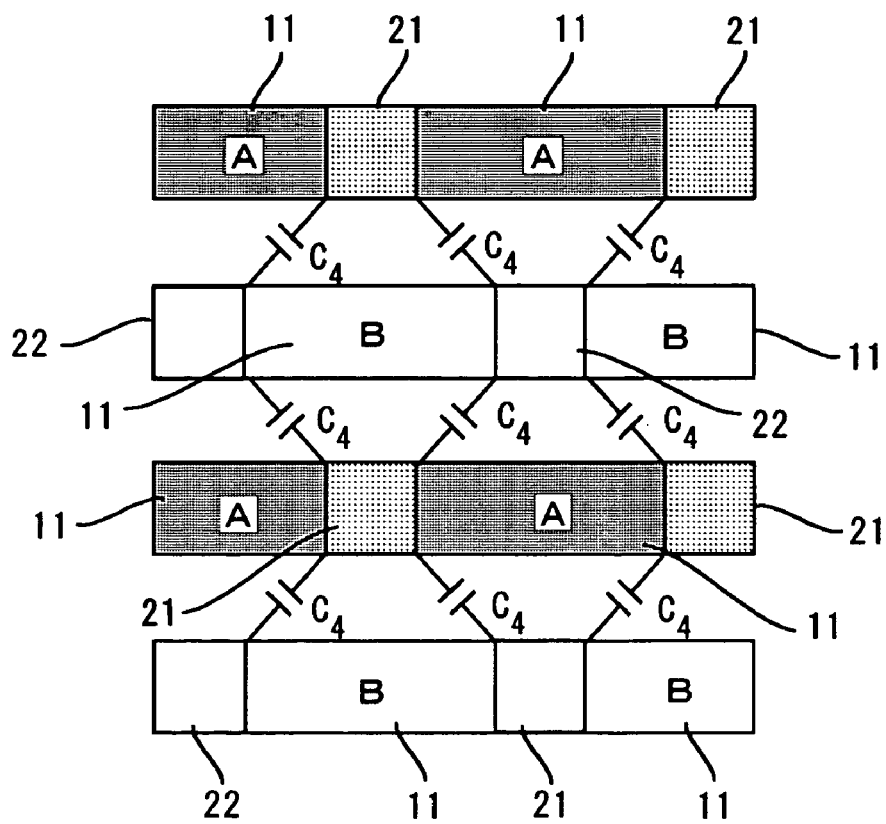
FIG. 7 is a sectional view taken along the line III-III of FIG. 3.

Referring next to FIGS. 5 to 7, the capacitance of the capacitor element according to this embodiment is described. FIG. 5 is a sectional view taken along the line I-I of FIG. 3, and FIG. 6 is a sectional view taken along the line II-II of FIG. 3. Further, FIG. 7 is a sectional view taken along the line III-III of FIG. 3.

The total capacitance of the capacitor element according to this embodiment is the sum of (1) a capacitance C1 between the lines of different electrodes (first electrode and second electrode) arranged in each layer (first layer, second layer, etc.) (see FIGS. 5 and 6), (2) a capacitance C2 between the lines of different electrodes adjacent to each other in the vertical direction (see FIGS. 5 and 6), (3) a capacitance C3 between the line forming the second electrode, and the first via hole diagonally facing the line via the dielectric, and between the line forming the first electrode and the second via hole diagonally facing the line via the dielectric (see FIGS. 5 and 6), (4) a capacitance C4 between the adjacent first via hole and second via hole (see FIG. 7), and (5) the total fringe capacitance Cf (see FIGS. 5 and 6).

According to the capacitor element of this embodiment, the lines of plural electrodes are alternately arranged in respective layers, and besides, longitudinal directions of the lines of adjacent first and second layers are different directions, and the first via holes connecting between the adjacent lines and the second via holes connecting between the adjacent lines are alternately arranged on the same plane (in a checkered pattern) Hence, as compared with Japanese Patent Translation Publication No. 2003-530699 and Japanese Unexamined Patent Publication No. 11-168182, the capacitance density can be increased in proportion to the number of via holes. Further, it is apparent from the net-like arrangement of current paths that the impedance can be made lower than those of Japanese Patent Translation Publication No. 2003-530699 and Japanese Unexamined Patent Publication No. 11-168182.

Next, a parasitic capacitance of the capacitor element is described. In recent years, in response to a request to increase the integrity of the semiconductor integrated circuit, there is a tendency to reduce a size of a device such as a transistor, an interlayer distance and a line pitch. Hence, a problem about an unnecessary parasitic capacitance in a portion where the capacitor element is formed becomes more serious than before. In order to accomplish surface area reduction, power consumption reduction and high speed processing, a technique of controlling the parasitic capacitance is desired.

A capacitor element with electrodes laminated on the substrate creates a parasitic capacitance between the electrode and the substrate. The main element of the parasitic capacitance is the capacitance between the substrate and the lowermost electrode. The capacitance is derived from the following expression 1. In the expression 1, $\epsilon_r$ denotes a dielectric constant, dp denotes a distance from the substrate to the lowermost electrode, and S denotes a surface area of the lowermost electrode facing the substrate.

$$C = \frac{\varepsilon_o \cdot \varepsilon_r \cdot S}{dp} \quad \text{(Expression 1)}$$

As understood from the expression 1, the parasitic capacitance increases in proportion to the surface area of the lowermost electrode.

According to the technique disclosed in Japanese Patent Translation Publication No. 2003-530699, as the lowermost electrodes, both the first electrode A and the second electrode B oppose the substrate, and almost the same parasitic capacitance is involved between both the electrodes and the substrate. In the case of applying this capacitor element to a switched capacitor circuit, the above parasitic capacitance gives an adverse influence at the time of distributing charges, leading to a large error.

The following expressions 2 and 3 are the transfer function expression taking the parasitic capacitance into account and the transfer function expression not taking such capacitance into account, respectively.

$$H(z) \equiv \frac{Vout(z)}{Vin(z)} = -\left(\frac{C1}{C2}\right)\frac{1}{(Z-1)} \quad \text{(Expression 2)}$$

-continued $$H(z) \equiv \frac{Vout(z)}{Vin(z)} = -\left(\frac{C1 + C_{p1}}{C2}\right)\frac{1}{(Z-1)} \quad \text{(Expression 3)}$$

Figure 8:
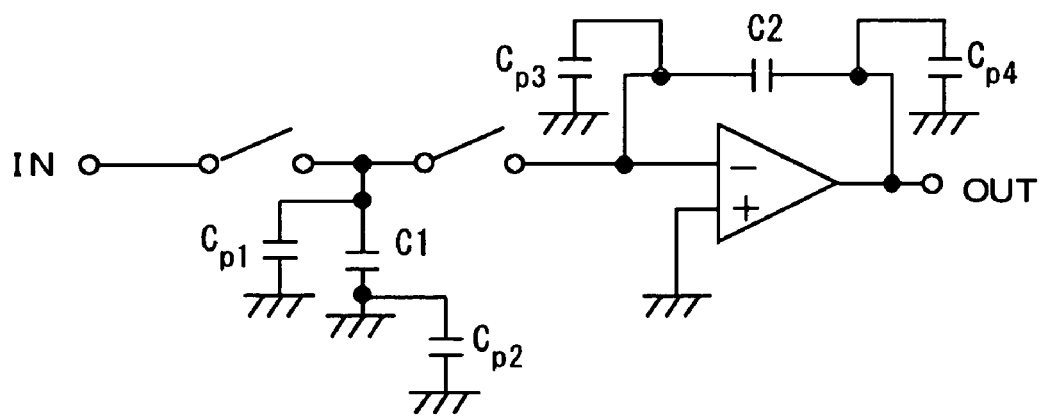
FIG. 8 shows a switched capacitor circuit.

If the parasitic capacitance is created at both ends of the capacitor as illustrated in the switched capacitor circuit of FIG. 8, an influence of the parasitic capacitance $C_{P1}$ leads to an error as understood from the above transfer function expressions.

On the other hand, according to the capacitor element of this embodiment, the lowermost electrode 10 has a planar shape, and serves as a part of one of the electrodes (in this embodiment, first electrode A), so only the first electrode A faces the substrate 30. Accordingly, the capacitance is only involved between the substrate and the first electrode A opposing the substrate as the lowermost electrode 10. Then, only a fringe capacitance is generated between the first layer lines 11 forming the second electrode B and the substrate. Accordingly, it is possible to significantly reduce the parasitic capacitance in this embodiment. In addition, even if the surface area for the capacitance is increased (in the case of enlarging the plate size of the lowermost electrode), the fringe capacitance is increased in slight amounts. Thus, the larger the surface area for the capacitance, the larger a difference in parasitic capacitance value between the capacitor element of the present invention and that of Japanese Patent Translation Publication No. 2003-530699.

If used as the capacitor in the switched capacitor circuit, the capacitance element of Japanese Patent Translation Publication No. 2003-530699 involves the parasitic capacitance on the input side of the capacitor as shown in FIG. 8, so its influence leads to an error at the time of distributing the charges. On the other hand, according to this embodiment, the error can be controlled as mentioned above. Further, according to this embodiment, the parasitic capacitance ratio can be further decreased by increasing the capacitance, so an error can be more effectively depressed.

In the illustrated examples of FIGS. 5 and 6, the parasitic capacitance of the second electrode B can be considerably reduced, but the large parasitic capacitance Cp is involved in the first electrode A. However, if the first electrode A is arranged on the sampling input side and the second electrode B is arranged on the sampling output side, the parasitic capacitance on the electrode A side causes no problem in an application using the capacitance.

EXAMPLE 1

FIGS. 9A and 9B illustrate simulation conditions for comparing the impedance measured at the end of the line of Comparative Example 1 of the related art with that of Example 1 of the present embodiment. FIG. 9A is an upper view of the capacitor element of Comparative Example 1, and FIG. 9B is an upper view of the capacitor element of Example 1. A laminate of three metal layers was used as the capacitor elements of Comparative Example 1 and Example 1. Further, the number of lines in the vertical direction of FIGS. 9A and 9B was fixed (entire length in the vertical direction was fixed to 2.2 µm). On the other hand, the number of lines in the horizontal direction of FIGS. 9A and 9B was changed to 6, 10, and 14 (entire length in the horizontal direction varied in the range of 2.2 µm to 3.8 µm).

Reference numeral 132 denotes an impedance measurement portion of the third layer line, and 133 denotes a terminal portion connected with the first layer line in the lowermost layer. Similarly, reference numeral 32 of FIG. 9B denotes an impedance measurement portion of the third layer line, and 33 denotes terminal portion connected with the first layer line in the lowermost layer.

FIG. 10 is a graph plotting impedance values measured in simulation with varying distances (horizontal distance) from the terminal portion under the above conditions. Table 1 summarizes capacitance values corresponding to the horizontal distance from the terminal portion of the capacitor element of Example 1 and those of Comparative Example 1. Comparative Example 1 and Example 1 are the same in that the vertical distance from the terminal portion to a measurement portion is 2.2 µm but differs from each other in the vertical distance set for the capacitance. That is, in Comparative Example 1, the vertical distance set for the capacitance is 2.4 µm, while in Example 1, the vertical distance set for the capacitance is 2.2 µm. Therefore, with the same surface area, the difference in capacitance value between the comparative example and the example becomes larger than that of Table 1.

TABLE 1

| | | HORIZONTAL DISTANCE OF CAPACITOR ELEMENT OF FIG. 9 | | |
|---|---|---|---|---|
| | | 2.2 µm | 3.0 µm | 3.8 µm |
| CAPACITANCE VALUE | COMPARATIVE EXAMPLE 1 | 3.3 fF | 4.5 fF | 5.8 fF |
| | EXAMPLE 1 | 3.5 fF | 4.8 fF | 6.0 fF |

The simulation result of the capacitor element of Comparative Example 1 is that, as the distance from the terminal portion to the measurement point increases (as a capacitance value increases), the impedance value increases. In contrast, the simulation result of the capacitor element of Example 1 is contrary to Comparative Example 1, that is, as the distance from the terminal portion to the measurement point increases (as the capacitance value increases), the impedance value is decreased.

If the terminal portion is relatively close to the measurement point, Comparative Example 1 shows lower impedance. This is because, if the terminal portion is relatively close to the measurement point, Example 1 has a relatively few current paths, and thus is supposed to show higher impedance than Comparative Example 1. In contrast, as the distance from the terminal portion to the measurement point increases, the capacitor element according to Example 1 attains lower impedance than Comparative Example 1. This is because, although Comparative Example 1 only has the current paths extending two-dimensionally (in the plane), in Example 1, the longitudinal directions of lines of adjacent layers cross each other, and the first via holes and the second via holes are alternately arranged, whereby more current paths are formed three-dimensionally in a net-like fashion.

Example 1 produces an effect of lowering the electrode impedance in the case of increasing a capacitance value. In general, capacitors used in an integrated circuit take a value not smaller than several tens of fF. Under this condition, Example 1 can attain the lower impedance than Comparative Example 1.

The capacitor element according to this embodiment gives a great advantage especially when used in the application such as AD conversion requiring a high responsibility during the capacitor charging/discharging period.

EXAMPLE 2

Next, a description is given of the measured capacitance values and parasitic capacitance values of Comparative Example 2 of the related art and those of Example 2 of this embodiment.

Figure 11A:
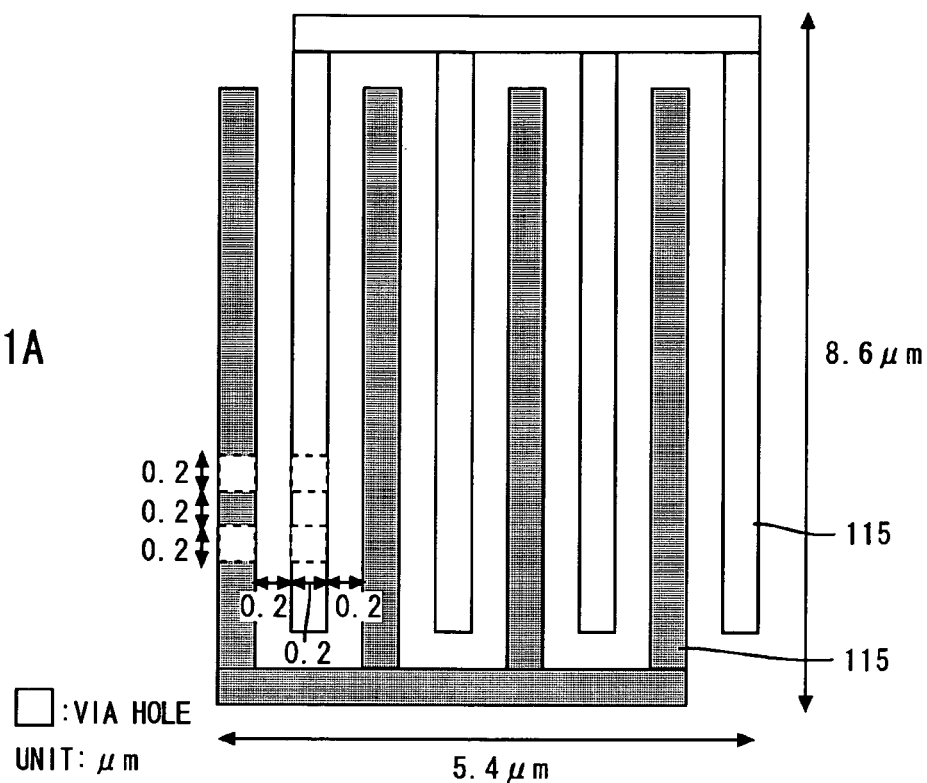
FIG. 11A is an upper view showing a capacitor element according to Comparative Example 2.
Figure 11B:
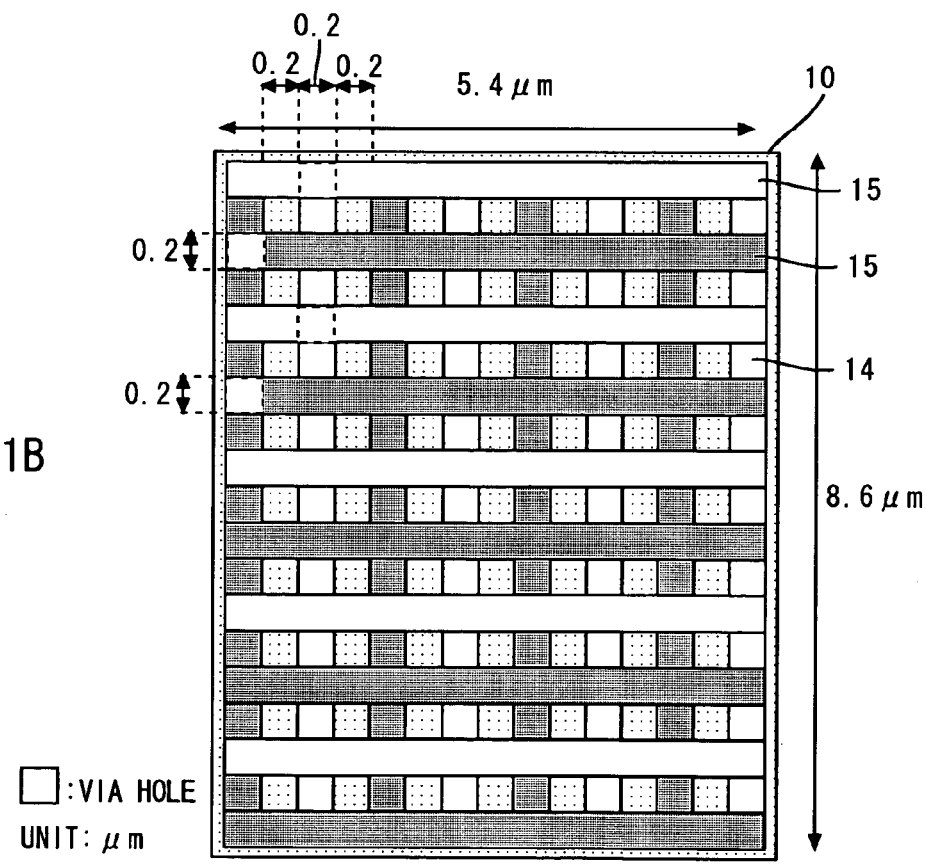
FIG. 11B is an upper view showing a capacitor element according to Example 2.

FIG. 11A is an upper view showing a capacitor element of Comparative Example 2, and FIG. 11B is an upper view showing the capacitor element of Example 2. The lowermost electrode 10 made from a polysilicon layer and the first layer line 11 to the fifth layer line 15 made from a metal layer were laminated at a process pitch of 0.13 µm, and the resultant laminate was used as the capacitor elements of Comparative Example 2 and Example 2. Further, the entire length in the vertical direction in the figure was set to 8.6 µm, and the entire length in the horizontal direction was set to 5.4 µm. In FIGS. 11A and 11B, some via holes formed between the fifth layer line and the fourth layer line are illustrated by the imaginary lines. The via hole measured 0.2 µm by 0.2 µm.

Table 2 shows the measured capacitance values and parasitic capacitance values of the capacitor elements according to Comparative Example 2 and Example 2. Here, the parasitic capacitance value refers to a parasitic capacitance value resulting from one of the two electrodes opposing the substrate in Comparative Example 2, and to a parasitic capacitance value resulting from an electrode not opposing the substrate in Example 2.

TABLE 2

| | COMPARATIVE EXAMPLE 2 | EXAMPLE 2 |
|---|---|---|
| CAPACITANCE VALUE | $55.2 \times 10^{-15}$ F | $58.4 \times 10^{-15}$ F |
| PARASITIC CAPACITANCE VALUE | $1.9 \times 10^{-15}$ F | $1.2 \times 10^{-15}$ F* |
| PARASITIC CAPACITANCE: CAPACITANCE | 1:29 | 1:49 |

*PARASITIC CAPACITANCE VALUE OF ELECTRODE NOT OPPOSING SUBSTRATE

As apparent from Table 2, Example 2 shows about 6% increase in capacitance value over that of Comparative Example 2; in contrast, Example 2 shows about 37% decrease in parasitic capacitance generated in the electrode.

As a result of comparing the ratios of the parasitic capacitance value to the capacitance value, Comparative Example 2 shows a ratio of 1:29, while Example 2 shows a ratio of 1:49. This reveals that the ratio of the parasitic capacitance to the total capacitance can be significantly reduced in Example 2. Besides, according to this embodiment, the ratio of the parasitic capacitance to the total capacitance can reduce in inverse proportion to the surface area set for the capacitance.

The above embodiment is given by way of example. It suffices if, for example, lines formed in the odd-numbered layers extend in the same direction and the lines formed in the even-numbered layers extend in the same direction. In place of the structure where the lines are formed so as to overlap each other, the stacked structure may be adopted. In addition, the number of lines in each layer is not fixed but may be changed as appropriate. Further, the description has been made of the example where the lines of the alternate layers (odd-numbered layers or even-numbered layers) which face each other across one layer form different electrodes, but the present invention is not limited thereto. The opposing lines of alternate layers may belong to the same electrode. Also, the above embodiment describes the example where the first layer lines and the second layer lines are arranged orthogonally, but the present invention is not limited thereto. The present invention is applicable to such an arrangement that the first direction in which the first layer line extends is different from the second direction in which the second layer line extends.

MODIFIED EXAMPLE 1

Figure 12:
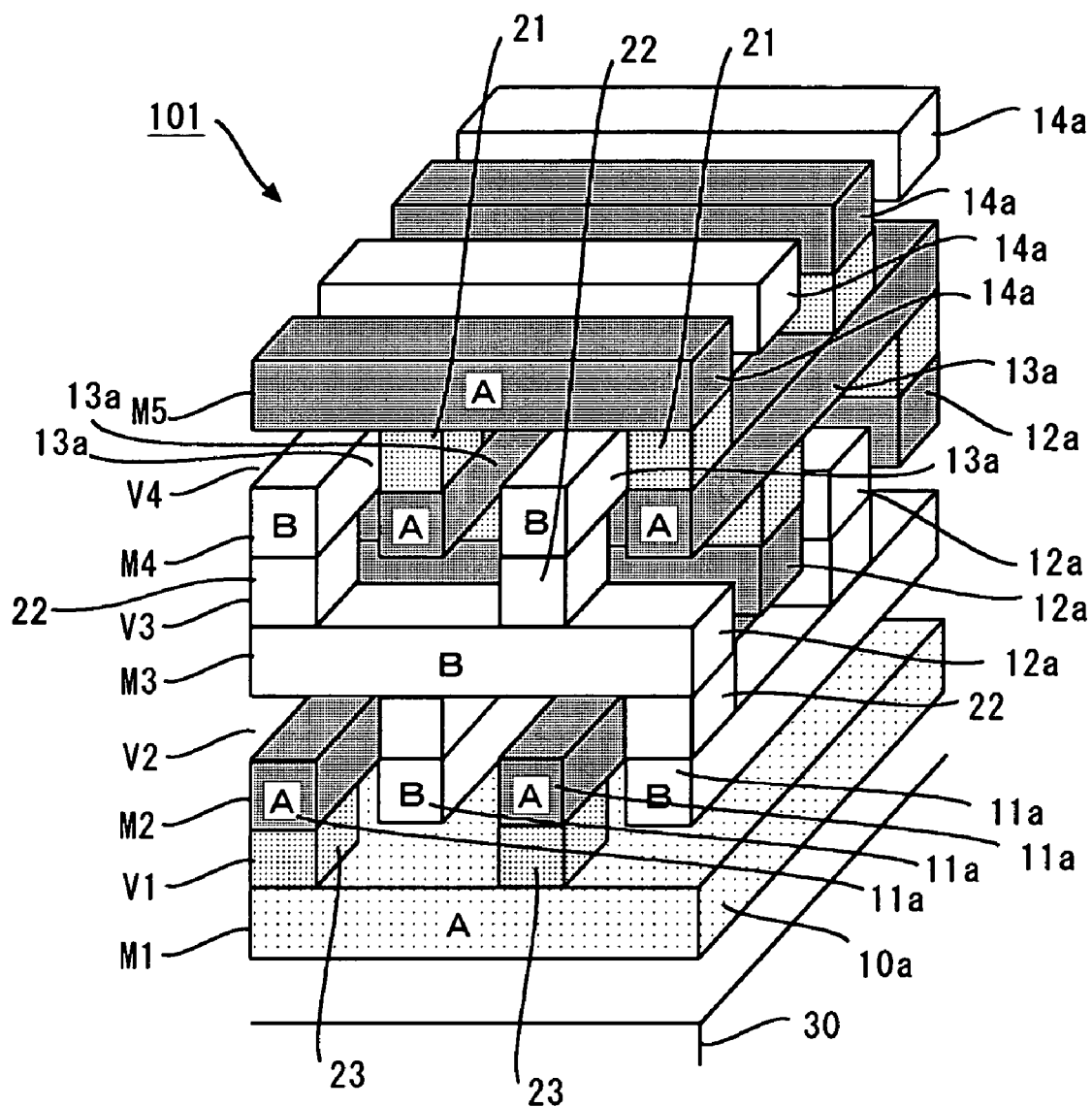
FIG. 12 is a perspective view showing a capacitor element according to Modified Example 1.

Next, a modified example of the capacitor element according to the embodiment is described. FIG. 12 is a perspective view of a capacitor element 101 of Modified Example 1. Hereinbelow, an explanation about the same components as those of the embodiment is omitted as appropriate.

The capacitor element 101 according to Modified Example 1 has basically the same structure as the above embodiment except the following. That is, although the lowermost electrode 10 according to the embodiment is made up of a polysilicon layer Poly, a lowermost electrode 10a of Modified Example 1 is made from a metal layer M1, which overlies the polysilicon layer in the general semiconductor manufacturing process. In other words, the distance dp between the substrate and the lowermost electrode is set larger than the above embodiment.

More specifically, while the above embodiment adopts the structure of FIG. 3, in this modified example, the lowermost electrode 10a is composed of a metal layer M1, a via hole layer V1 connecting between the lowermost electrode 10a and the first layer line 11a, a metal layer M2 forming the first layer line 11, a via hole layer V2 laminated thereon, a metal layer M3 forming a second layer line 12a, a via hole layer V3 laminated thereon, a metal layer M4 forming the third layer line 13a, a via hole layer V4 laminated thereon, and a metal layer MS forming the fourth layer line 14a.

According to Modified Example 1, the distance dp between the substrate and the lowermost electrode 10a is set larger than the above embodiment. Hence, although a capacitance value per unit area is lowered, the parasitic capacitance generated between the electrode and the substrate can be reduced. In order to further reduce the parasitic capacitance, the metal layer M2, the metal layer M3, etc., which are used as an upper layer in the general semiconductor manufacturing process, may be used for the lowermost electrode 10a.

MODIFIED EXAMPLE 2

Figure 13:
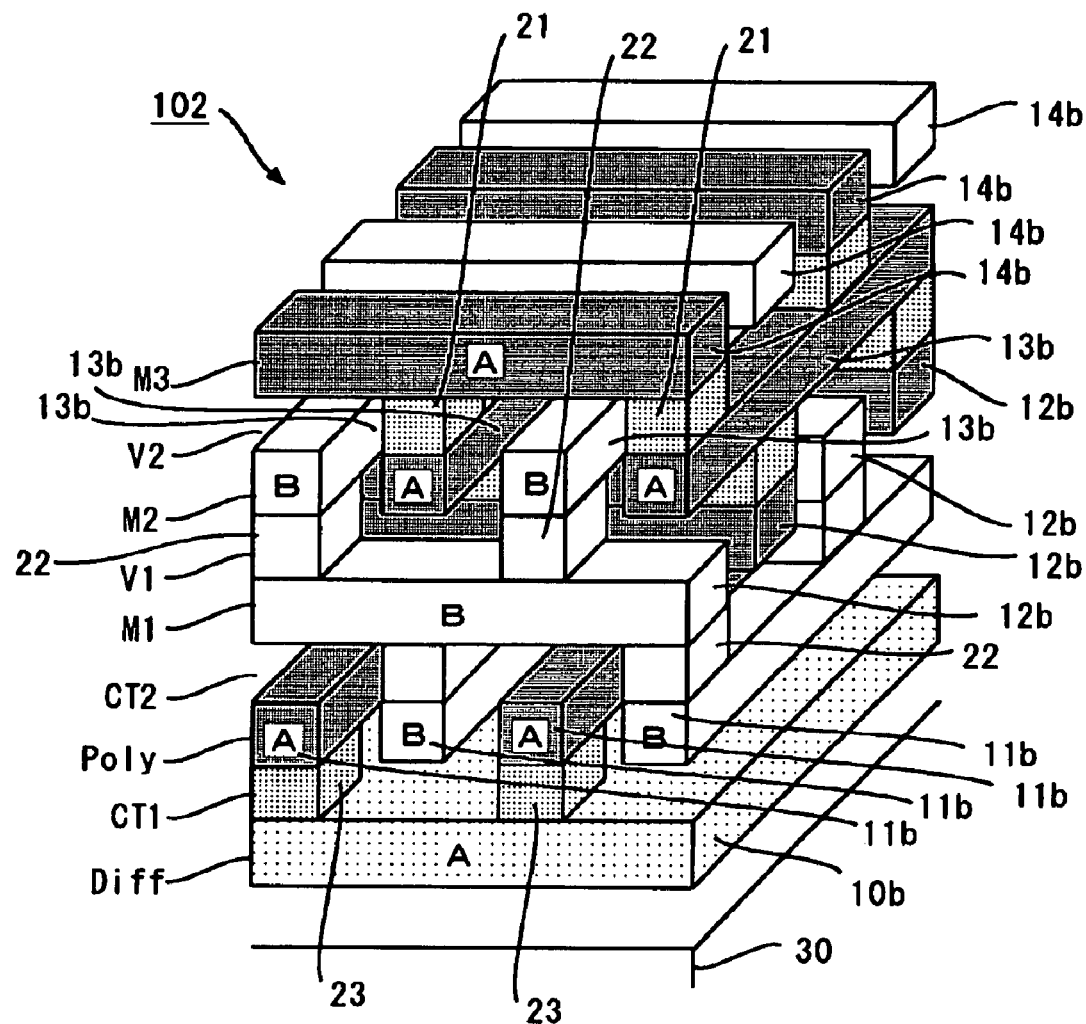
FIG. 13 is a perspective view showing a capacitor element according to Modified Example 2.

Next, another modified example of the capacitor element according to the above embodiment is described. FIG. 13 is a perspective view of a capacitor element 102 according to Modified Example 2.

The capacitor element 102 according to Modified Example 2 basically has the same structure as the above embodiment except the following. That is, the lowermost electrode 10 according to the above embodiment is made from a polysilicon layer Poly, while a lowermost electrode 10b according to Modified Example 2 is made from a diffusion layer Diff, which underlies the polysilicon layer in the general semiconductor manufacturing process. In other words, the distance dp between the substrate and the lowermost electrode is made smaller than the above embodiment.

More specifically, although the lowest electrode of the above embodiment is structured as shown in FIG. 3, the lowermost electrode 10b of Modified Example 2 is composed of the diffusion layer Diff, a contact layer CT1 forming a via hole connecting between the lowermost electrode 10b and the first layer line 11b, the first layer line 11 made from a polysilicon layer Poly, a contact layer CT2 forming a via hole and laminated thereon, a metal layer M1 forming the second layer line 12a, the via hole layer V1 laminated thereon, a metal layer M2 forming a third layer line 13a, a via hole layer V2 laminated thereon, and a metal layer M3 forming a fourth layer line 14a.

According to Modified Example 2, the distance dp between the substrate and the lowermost electrode 10b is made smaller than the above embodiment. Hence, although a capacitance value per unit area is lowered, the parasitic capacitance generated between the electrode and the substrate can be reduced.

MODIFIED EXAMPLE 3

Figure 14:
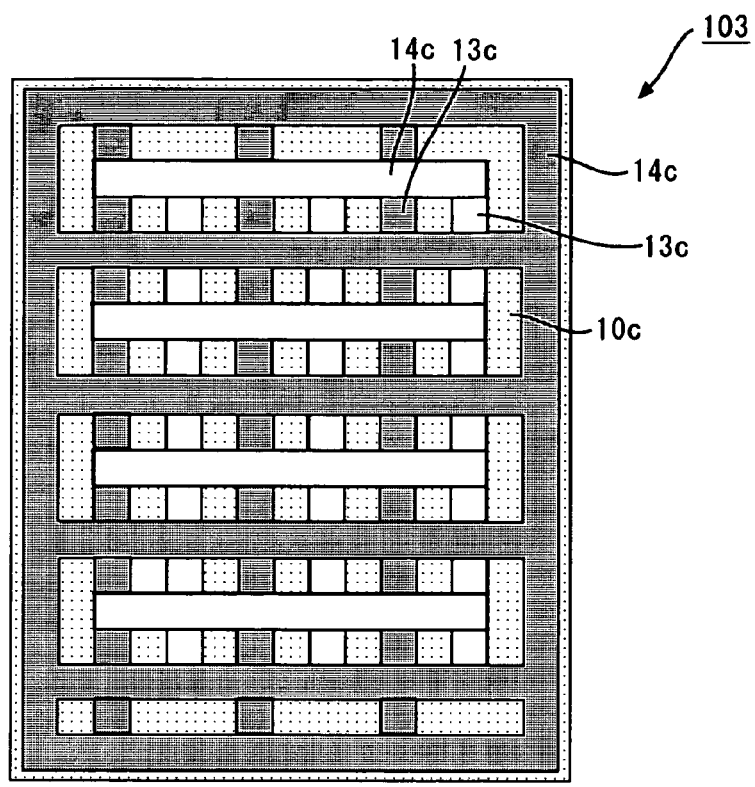
FIG. 14 is an upper view showing a capacitor element according to Modified Example 3.
Figure 15:
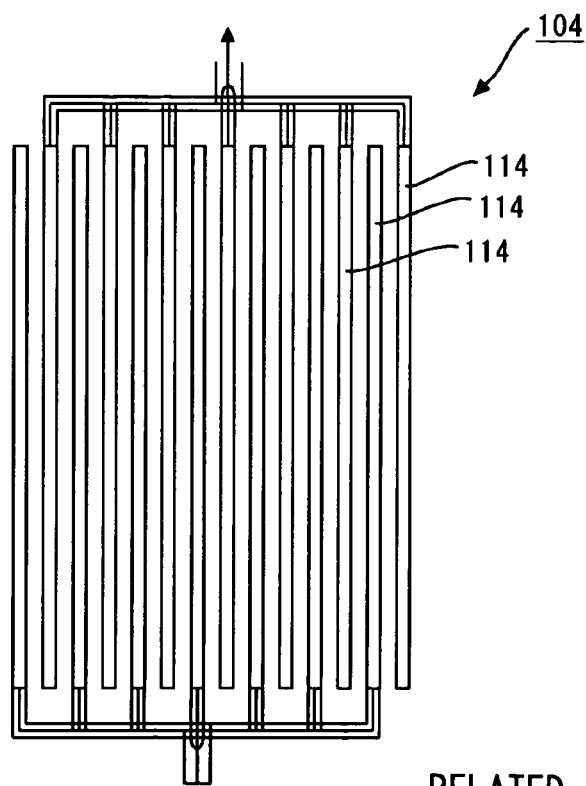
FIG. 15 is an upper view showing a capacitor element according to Related Art 1.
Figure 16:
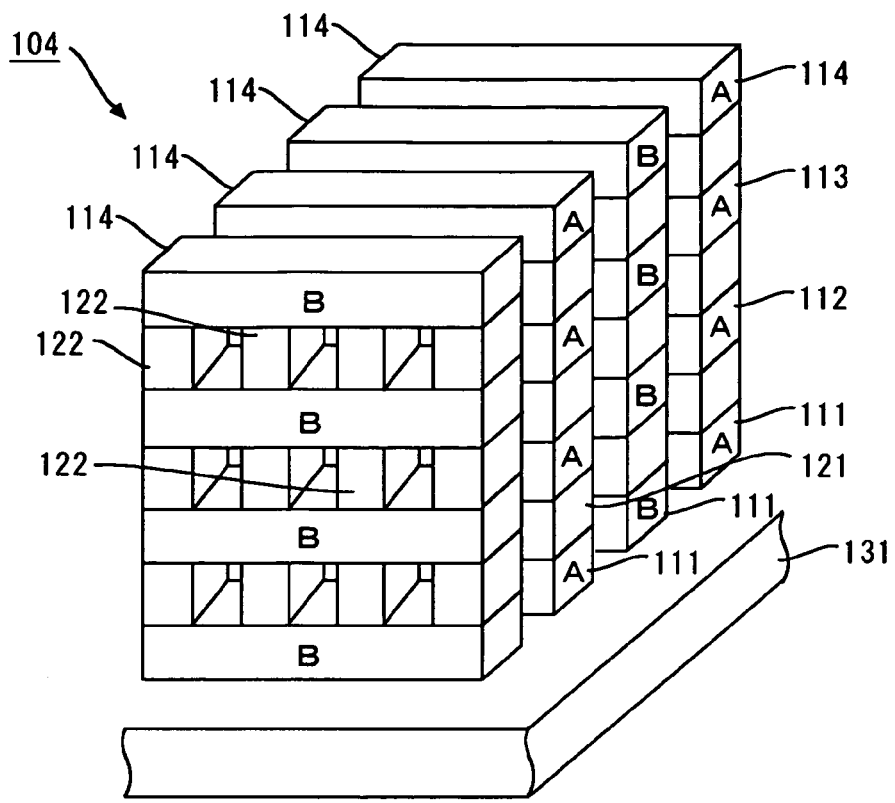
FIG. 16 is a perspective view showing a capacitor element according to Related Art 1.
Figure 17:
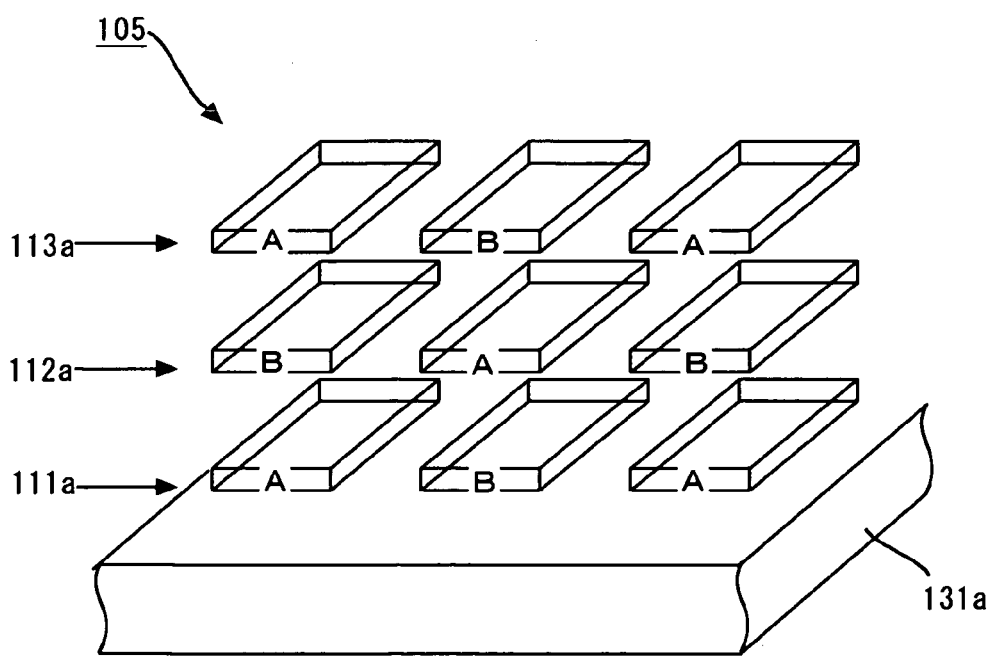
FIG. 17 is a perspective view showing a capacitor element according to Related Art 2.
Figure 18A:
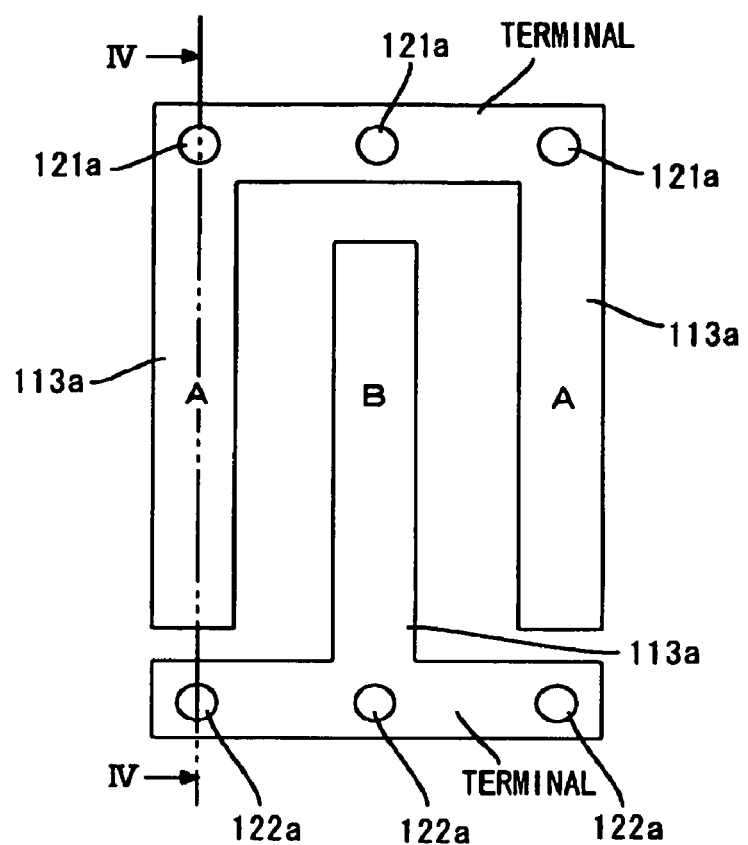
FIG. 18A is an upper view showing a capacitor element according to Related Art 2.
Figure 18B:
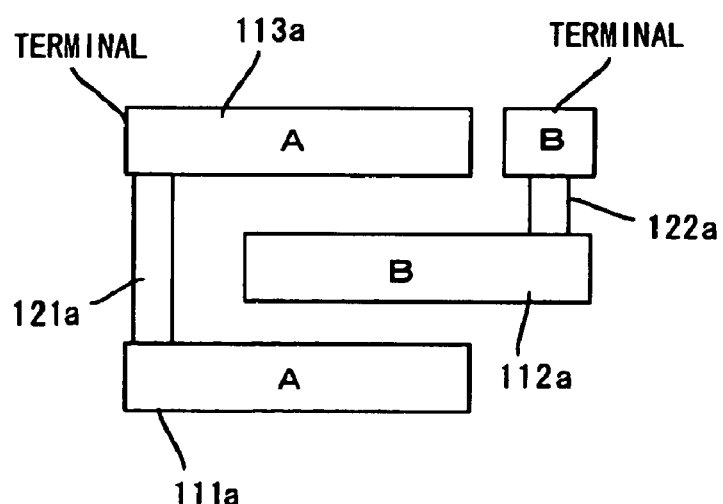
FIG. 18B is a sectional view taken along the line IV-IV of FIG. 18A.

Next, still another modified example of the capacitor element according to the embodiment is described. FIG. 14 is a upper view showing a capacitor element 103 according to Modified Example 3.

The capacitor element 103 according to Modified Example 3 basically has the same structure as the above embodiment except the following. That is, Modified Example 3 differs from the above embodiment in that one electrode (A or B) surrounds each layer forming the capacitance. One electrode (A or B) comprises a ring shaped portion on at least one of the first layers and the second layers. In Modified Example 3, as shown in FIG. 14, the first electrode A surrounds the layers of the fourth layer line 14c, the third layer line 13c, and the like. With such a structure, the parasitic capacitance resulting from the element or line arranged close to the capacitor element can be merged into the capacitance with one electrode.

By using such a structure in any layer, the parasitic capacitance can be made smaller than the conventional ones. Beside, arranging one electrode so as to surround all the layers forming the capacitance makes it possible to more effectively reduce the parasitic capacitance.

As another way to merge the parasitic capacitance resulting from the element or line close to the capacitor element into the capacitance with one electrode, the plate electrode may be formed in the side wall or uppermost portion like the lowermost electrode.

It is apparent that the present invention is not limited to the above embodiment and it may be modified and changed without departing from the scope and spirit of the invention.

What is claimed is:

1. A semiconductor device comprising:
   a capacitor including a first electrode, a second electrode and an insulator therebetween;
   first layers and second layers laminated alternately, the first layers each including lines of a first electrode and lines of a second electrode arranged alternately and extending in a first direction, the second layers each including lines of the first electrode and lines of the second electrode arranged alternately and extending in a second direction different from the first direction;
   first via holes connecting the lines of the first electrode in each of the first layers and the lines of the first electrode in each of the second layers at crossing points of the lines of the first electrode of said first layers in said first direction with said first electrode of said second layers in said second direction; and
   second via holes connecting the lines of the second electrode in each of the first layers and the lines of the second electrode in each of the second layers at crossing points of the lines of the second electrode of said first layers in said first direction with said second electrode of said second layers in said second direction.

2. The semiconductor device according to claim 1, further comprising a plate electrode that is interposed between the lowermost one of the first and the second layers and a semiconductor substrate via a dielectric, and constitutes a part of one of the first electrode and the second electrode.

3. The semiconductor device according to claim 2, wherein the plate electrode comprises one member selected from the group consisting of a polysilicon layer, a metal layer and a diffusion layer.

4. The semiconductor device according to claim 2, wherein one of the first electrode and the second electrode comprises a ring shaped portion on at least one of the first layers and the second layers.

5. The semiconductor device according to claim 2, further comprising a plate electrode which faces one of, at least a part of an end portion of the first layer and the second layer, and the uppermost one of the first layers and the second layers via a dielectric, and constitutes a part of one of the first electrode and the second electrode.

6. The semiconductor device according to claim 1, wherein one of the first electrode and the second electrode comprises a ring shaped portion on at least one of the first layers and the second layers.

7. The semiconductor device according to claim 1, further comprising a plate electrode which faces one of, at least a part of an end portion of the first layer and the second layer, and the uppermost one of the first layers and the second layers via a dielectric, and constitutes a part of one of the first electrode and the second electrode.

8. The semiconductor device according to claim 1, wherein the lines of the different first layers are formed to overlap each other and the lines of the different second layers are formed to overlap each other in a stacking direction of the first layers and the second layers.

9. The semiconductor device according to claim 8, wherein the lines of the first layers formed to overlap each other are arranged such that the lines of the first electrode and the lines of the second electrode are alternately arranged in the stacking direction, and the lines of the second layers formed to overlap each other are arranged such that the lines of the first electrode and the lines of the second electrode are alternately arranged in the stacking direction.

10. The semiconductor device according to claim 1, wherein the first via holes are disposed an equal distance from other first via holes which are adjacent to the first via holes, and
wherein the second via holes are disposed an equal distance from other second via holes which are adjacent to the second via holes.

11. The semiconductor device according to claim 10, wherein at least one of the first via holes is disposed an equal distance from at least two of other second via holes which are adjacent to the first via hole, and
wherein at least one of the second via holes is disposed an equal distance from other first via holes which are adjacent to the second via hole.

12. A semiconductor device comprising:
a capacitor including a first electrode, a second electrode and an insulator therebetween;
a first layer including lines of a first electrode and lines of a second electrode, the lines of the first electrode and the lines of the second electrode being alternately arranged in a first direction;
a second layer laminated with the first layer and including lines of the first electrode extending in a second direction different from the lines of the first electrode and the lines of the second electrode in the first layer; and
via holes connecting the lines of the first and second electrodes in the first layer with the lines of the first and second electrodes, respectively, in the second layer, where said lines of said first and second electrodes cross between said first direction of said first layer with said second direction of said second layer.

13. The semiconductor device according to claim 12, wherein the via holes are disposed an equal distance from other via holes which are adjacent to the via holes.

14. The semiconductor device according to claim 13, wherein via holes connecting the lines of the first electrode in the first layer with the lines of the first electrode in the second layer are disposed an equal distance from via holes connecting the lines of the second electrode in the first layer with the lines of the second electrode in the second layer.

15. A semiconductor device comprising:
a capacitor including a first electrode, a second electrode and an insulator therebetween;
a first layer including lines of a first electrode and lines of a second electrode, the lines of the first electrode and the lines of the second electrode being alternately arranged;
a second layer laminated with the first layer and including lines of the first electrode and the second electrode extending in a direction different from the lines of the first electrode and the lines of the second electrode in the first layer;
first via holes connecting the lines of the first electrode of the first layer and the lines of the first electrode of the second layer; and
second via holes connecting the lines of the second electrode of the first layer and the lines of the second electrode of the second layer,
wherein the first and second via holes are disposed an equal distance from other first and second via holes adjacent said first and second via holes, respectively,
wherein at least one of the first via holes is disposed an equal distance from at least three other first via holes which are adjacent to the first via hole, and
wherein at least one of the second via holes is disposed an equal distance from at least three other second via holes which are adjacent to the second via hole.

16. The semiconductor device according to claim 15, wherein the first via holes are disposed an equal distance from other second via holes which are adjacent to the first via holes, and
wherein the second via holes are disposed an equal distance from other first via holes which are adjacent to the second via holes.

17. The semiconductor device according to claim 15, further comprising a plate electrode interposed between a lowermost one of the first and the second layer and a semiconductor substrate via a dielectric, and forms a part of one of the first electrode and the second electrode.

18. The semiconductor device according to claim 15, wherein the lines of the first layer overlap the lines of the second layer in a stacking direction of the first and the second layers.

19. The semiconductor device according to claim 18, wherein the first via holes are formed at crossing points between the first electrodes of the first and second layers, and the second via holes are formed at crossing points between the second electrodes of the first and second layers.

* * * * *